United States Patent
Choi et al.

(10) Patent No.: US 10,342,135 B2
(45) Date of Patent: Jul. 2, 2019

(54) PRINTED CIRCUIT BOARD AND MANUFACTURING METHOD THEREOF, AND SEMICONDUCTOR PACKAGE INCLUDING THE PRINTED CIRCUIT BOARD

(71) Applicant: SAMSUNG ELECTRO-MECHANICS CO., LTD., Suwon-si (KR)

(72) Inventors: Seong Ryul Choi, Seoul (KR); Suk Chang Hong, Yeongi-gun (KR); Sang Kab Park, Cheongju (KR); Kwang Seop Youm, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/014,059

(22) Filed: Feb. 3, 2016

(65) Prior Publication Data

US 2016/0157353 A1 Jun. 2, 2016

Related U.S. Application Data

(63) Continuation of application No. 14/068,628, filed on Oct. 31, 2013, now abandoned.

(30) Foreign Application Priority Data

Apr. 9, 2013 (KR) .......................... 10-2013-0038654

(51) Int. Cl.
*H01L 21/00* (2006.01)
*H05K 1/18* (2006.01)
(Continued)

(52) U.S. Cl.
CPC ........ *H05K 1/183* (2013.01); *H01L 23/49811* (2013.01); *H01L 23/5389* (2013.01);
(Continued)

(58) Field of Classification Search
CPC . H01L 23/16; H01L 23/3121; H01L 23/5389; H01L 24/19; H01L 24/83;
(Continued)

(56) References Cited

U.S. PATENT DOCUMENTS 7,894,203 B2 2/2011 Kariya et al.
2006/0043568 A1 3/2006 Abe et al.
(Continued)

FOREIGN PATENT DOCUMENTS

JP 2005-512335 A 4/2005
KR 1997-7007576 A 12/1997
(Continued)

OTHER PUBLICATIONS

Korean Office Action dated Feb. 26, 2014 in corresponding Korean Application No. 10-2013-0038654

*Primary Examiner* — Ahmed N Sefer
(74) *Attorney, Agent, or Firm* — NSIP Law

(57) ABSTRACT

Disclosed herein are a printed circuit board, a manufacturing method thereof, and a semiconductor package including the printed circuit board. The printed circuit board includes a base substrate including a plurality of circuit patterns, a cavity formed above the base substrate, a pad embedded in the base substrate and being exposed through the substrate bottom surface of the cavity, and an electronic component mounted in the cavity and electrically connected to the pad. According to the present invention, a cavity having a predetermined depth is formed in a base substrate of a printed circuit board so as to mount an electronic component therein, such that a gap between an upper semiconductor package and a lower semiconductor package may be obtained even if pitches between the balls are decreased for high density and high performance of the upper semicon- (Continued)

ductor package in the manufacturing of a semiconductor package having a PoP structure.

7 Claims, 6 Drawing Sheets

(51) Int. Cl.
*H01L 23/498* (2006.01)
*H01L 23/538* (2006.01)
*H05K 1/11* (2006.01)
*H01L 21/48* (2006.01)
*H05K 3/46* (2006.01)

(52) U.S. Cl.
CPC ............ *H05K 1/112* (2013.01); *H01L 21/486* (2013.01); *H01L 23/49827* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01); *H05K 3/4697* (2013.01); *H05K 2201/10492* (2013.01); *H05K 2201/10515* (2013.01); *H05K 2201/10734* (2013.01); *Y10T 29/49165* (2015.01)

(58) Field of Classification Search
CPC ... H01L 2924/1461; H01L 2924/12041; H01L 2224/92244; H01L 2224/73267; H01L 2224/32225; H01L 2924/014; H01L 2924/01075; H01L 2924/01006; H01L 2924/00
See application file for complete search history.

(56) References Cited

U.S. PATENT DOCUMENTS

| | | | |
|---|---|---|---|
| 2007/0108561 A1 | 5/2007 | Webster et al. | |
| 2009/0107708 A1* | 4/2009 | Takahashi | H05K 1/183 174/257 |
| 2010/0019368 A1 | 1/2010 | Shin | |
| 2010/0206619 A1* | 8/2010 | Chen | H01L 23/13 174/252 |
| 2011/0084382 A1* | 4/2011 | Chen | H01L 23/544 257/737 |
| 2011/0290540 A1 | 12/2011 | Jung et al. | |
| 2011/0304016 A1 | 12/2011 | Nakamura et al. | |
| 2012/0267157 A1* | 10/2012 | Ko | H01L 21/4857 174/262 |
| 2013/0032388 A1 | 2/2013 | Lin et al. | |
| 2013/0032938 A1 | 2/2013 | Lin et al. | |
| 2014/0054080 A1* | 2/2014 | Sato | H05K 1/183 174/266 |
| 2014/0070396 A1* | 3/2014 | Kyozuka | H01L 24/19 257/698 |
| 2015/0050781 A1 | 2/2015 | Guzek et al. | |
| 2016/0234941 A1* | 8/2016 | Choi | H01L 23/5389 |

FOREIGN PATENT DOCUMENTS

| | | |
|---|---|---|
| KR | 10-0633850 B1 | 10/2006 |
| KR | 10-0633852 B1 | 10/2006 |
| KR | 10-0792352 B1 | 1/2008 |
| KR | 10-2008-0077934 A | 8/2008 |
| KR | 10-2009-0074837 A | 7/2009 |
| KR | 10-2010-0011648 A | 2/2010 |

* cited by examiner

[FIG. 1]
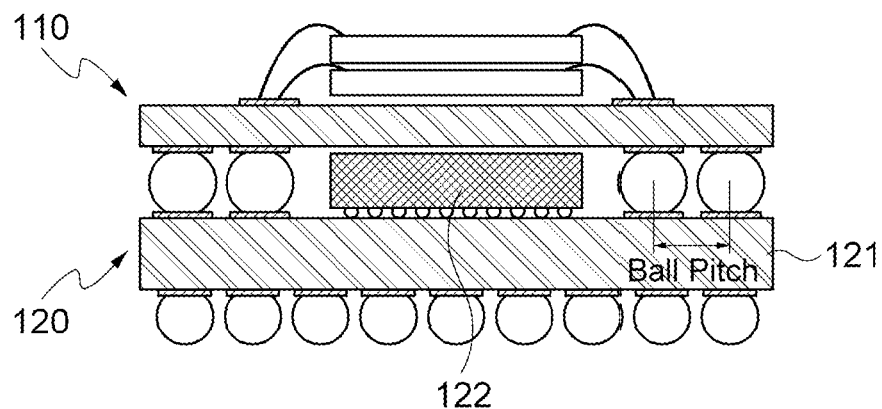
- PRIOR ART -
[FIG. 2]
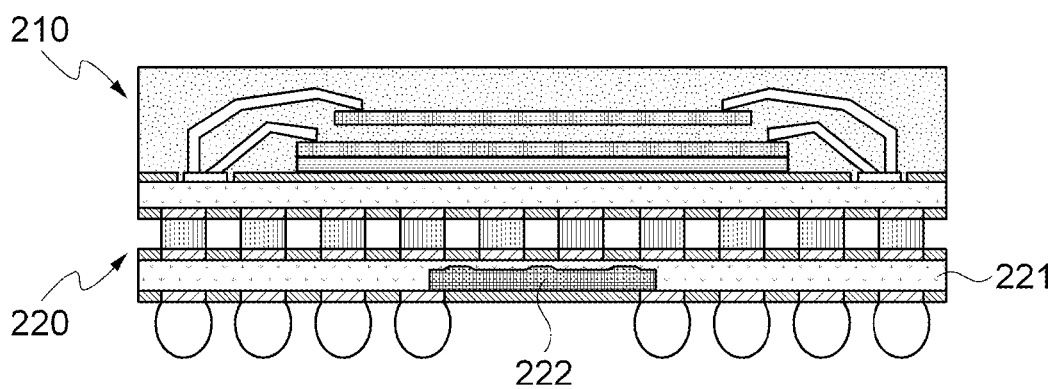
- PRIOR ART -

[FIG.3]
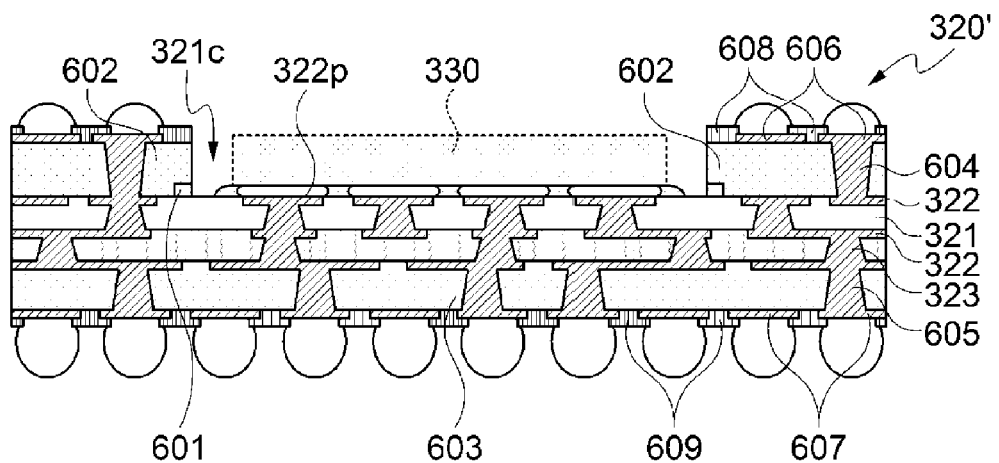
[FIG.4]
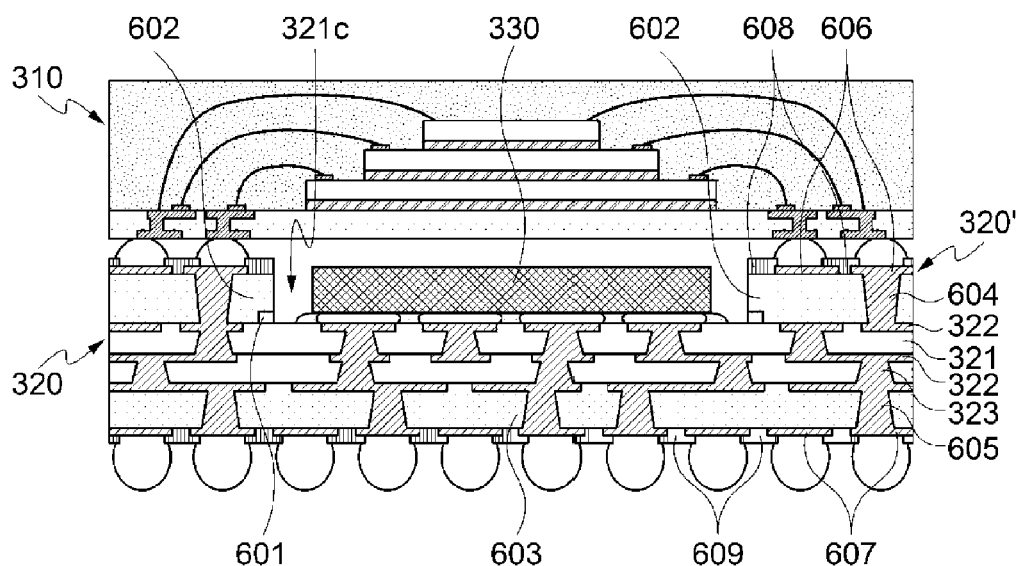

[FIG. 5]
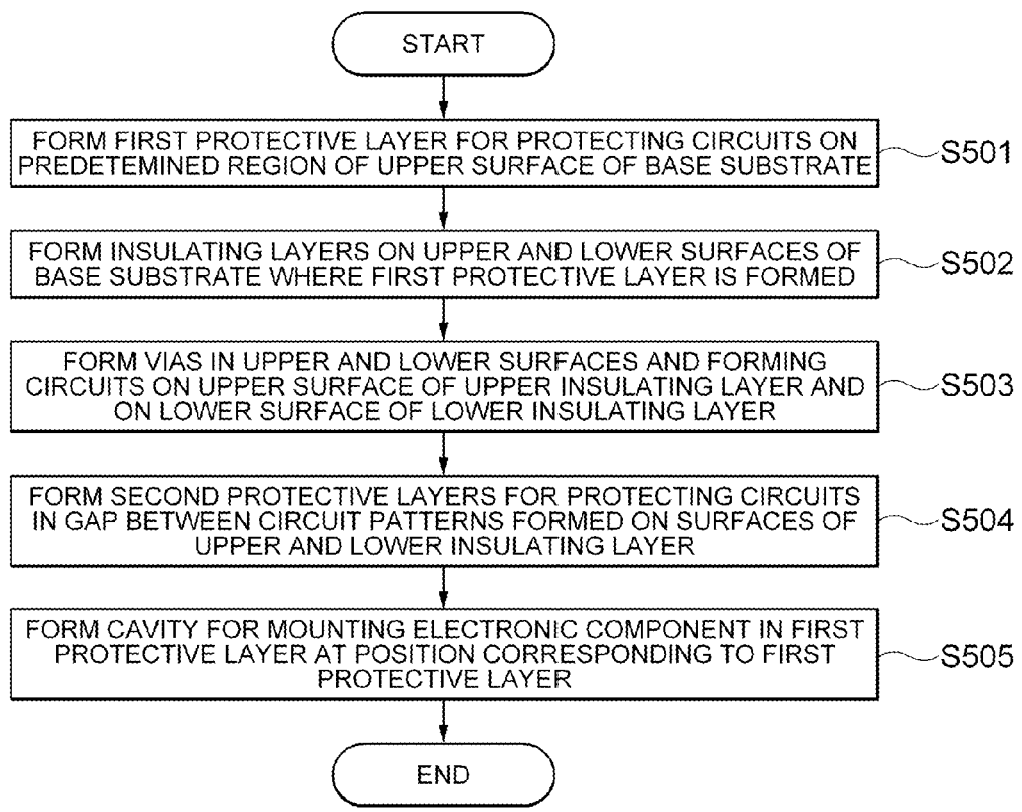
[FIG. 6A]
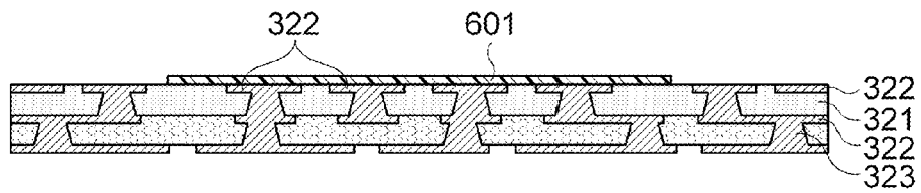

[FIG. 6B]
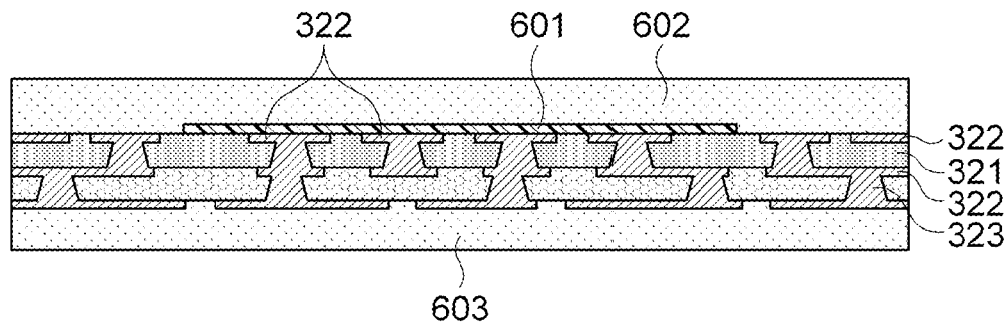
[FIG. 6C]
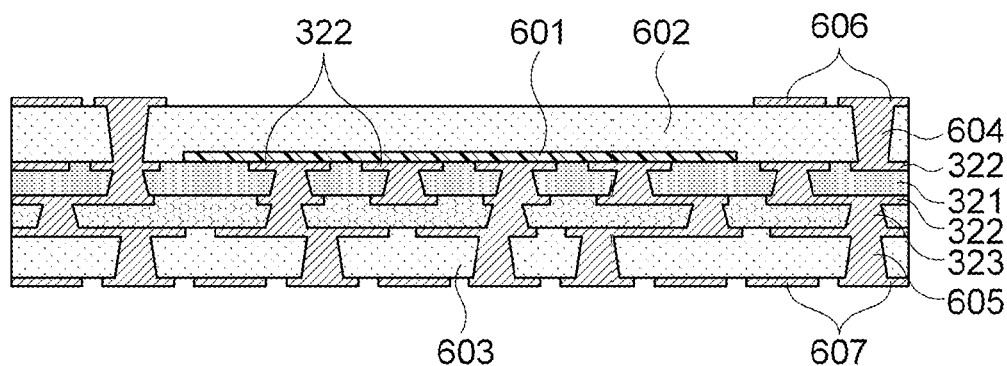
[FIG. 6D]
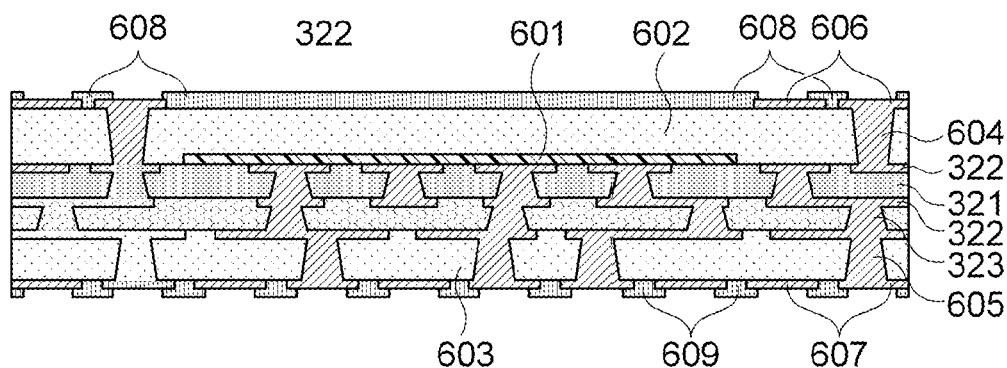

[FIG. 6E]
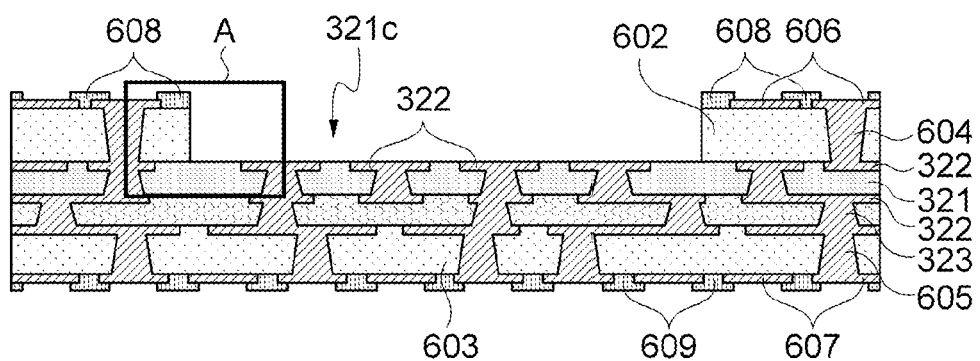
[FIG. 7A]
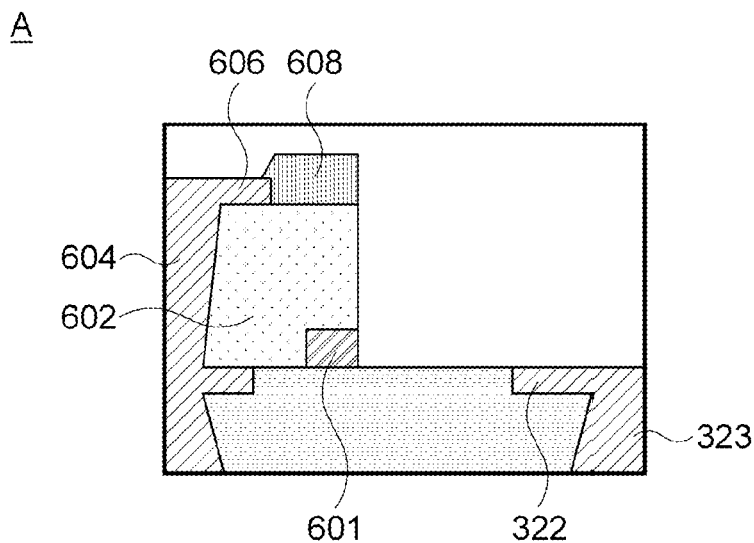

[FIG. 7B]
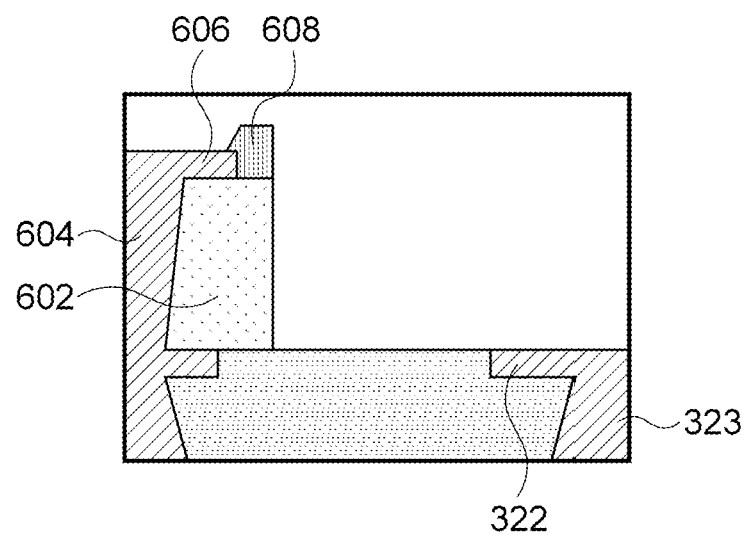

PRINTED CIRCUIT BOARD AND MANUFACTURING METHOD THEREOF, AND SEMICONDUCTOR PACKAGE INCLUDING THE PRINTED CIRCUIT BOARD

CROSS REFERENCE(S) TO RELATED APPLICATIONS

This application is a U.S. continuation application of U.S. patent application Ser. No. 14/068,628, filed Oct. 31, 2013, which claims the benefit under 35 U.S.C. § 119(a) of Korean Patent Application No. 10-2013-0038654 filed with the Korean Intellectual Property Office on Apr. 9, 2013, the disclosures of which are incorporated herein by reference.

BACKGROUND OF THE INVENTION

1. Technical Field

The present invention relates to a printed circuit board (PCB), a manufacturing method thereof, and a semiconductor package including the printed circuit board. More specifically, the present invention relates to a printed circuit board in which a cavity for mounting an electronic component is formed on its upper surface so that a gap between upper and lower packages is obtained at the time of manufacturing a semiconductor package having a package on package (PoP) structure.

2. Description of the Related Art

Recently, as mobile products become thinned and highly functional, the number of inputs/outputs (I/O) of flip chips employed in the mobile products has been increased accordingly. Further, as the number of the I/Os increases, it is required to provide fine pitch solder bumps on a PCB.

As shown in FIG. 1, in a typical semiconductor package having a PoP structure, a electronic component 122 (e.g., AP chip) is mounted on the upper surface of the PCB 121 of the lower semiconductor package. In this structure, if the ball pitch is reduced in order to increase the number of I/Os of the upper semiconductor package 110, it is difficult to have a sufficient gap between the upper semiconductor package and the lower semiconductor package.

To cope with this, a structure has been proposed in which an electronic component 222 (e.g., a IC chip) is embedded in a PCB 221 as shown in FIG. 2. However, in this structure, costly IC chips in PCBs failed during the manufacturing process are discarded together with the boards, thereby causing the manufacturing cost to be increased. In FIG. 2, reference numerals 210 and 220 denote the upper semiconductor and the lower semiconductor, respectively.

RELATED ART DOCUMENTS

Patent Documents (Patent Document 1) Korean Patent Laid-Open Publication No. 10-1997-7007576
(Patent Document 2) Japanese Patent Laid-Open Publication No. 2005-512335

SUMMARY OF THE INVENTION

An object of the present invention is to provide a printed circuit board in which a cavity having a predetermined depth is formed in a base substrate of the printed circuit board so as to mount an electronic component therein, such that a gap between an upper semiconductor package and a lower semiconductor package may be obtained even if pitches between the balls are decreased for high density and high performance of the upper semiconductor package in the manufacturing of a semiconductor package having a PoP structure, a manufacturing method thereof, and a semiconductor package including the printed circuit board.

According to an exemplary embodiment of the present invention, there is provided a printed circuit board, including: a base substrate including a plurality of circuit patterns; a cavity formed above the base substrate; a pad embedded in the base substrate and being exposed through the substrate bottom surface of the cavity; and an electronic component mounted in the cavity and electrically connected to the pad.

The top surfaces of the pads and the bottom surface of the cavity may be in the same plane.

An alignment pattern for forming the cavity may be formed at a lower portion of a sidewall of the cavity The electronic component may include external terminals and may be mounted in a face-down position in which the external terminals face the pads.

The printed circuit board may further include a via formed in the base substrate and electrically connecting the circuit patterns to each other and the circuit patterns to the pad.

According to another exemplary embodiment of the present invention, there is provided a manufacturing method of a printed circuit board, the method including: forming a first protective layer for protecting circuits on a predetermined region of an upper surface of a base substrate; forming insulating layers on the upper surface of the base substrate on which the first protective layer is formed, and on a lower surface of the base substrate; forming vias in the upper insulating layer and in the lower insulating layer and then forming circuits on an upper surface of the upper insulating layer and a lower surface of the lower insulating layer; forming second protective layers for protecting circuits gaps between the circuit patterns formed on the surfaces of the upper and lower insulating layers; and forming a cavity for mounting the electronic component in the upper insulating layer at a position corresponding to the first protective layer 601.

The base substrate may have circuits formed on the upper surface, the lower surface and an inside thereof, and may have a via connecting the circuits on the upper surface and on the lower surface to each other.

In the forming of the cavity, the first protective layer embedded in the upper insulating layer may be removed so that the top surfaces of the circuit patterns exposed through the bottom surface of the cavity and the bottom surface are in the same plane with no difference in level.

Preferably, in the forming of the cavity, a part of the first protective layer may remain at a lower portion of a sidewall of the cavity.

According to yet another exemplary embodiment of the present invention, there is provided a semiconductor package having a PoP structure of which an upper semiconductor package is stacked on an lower semiconductor package, the lower semiconductor package comprising: a printed circuit board having a cavity of a predetermined size formed at a predetermined region of its upper surface; and an electronic component mounted in the cavity, wherein the printed circuit board includes a base substrate including a plurality of circuit patterns; a cavity formed above the base substrate; a pad embedded in the base substrate and being exposed through the substrate bottom surface of the cavity.

Preferably, the top surfaces of the pads and the bottom surface of the cavity may be in the same plane.

An alignment pattern for forming the cavity may be formed at a lower portion of a sidewall of the cavity The electronic component may include external terminals and may be mounted in a face-down position in which the external terminals face the pads.

The printed circuit board may further include a via formed in the base substrate and electrically connecting the circuit patterns to each other and the circuit patterns to the pad.

BRIEF DESCRIPTION OF THE DRAWINGS

FIG. 1 is a view illustrating an example of a typical semiconductor package having a PoP structure;

FIG. 2 is a view illustrating another example of a typical semiconductor package having a PoP structure;

FIG. 3 is a cross-sectional view showing a structure of a printed circuit board according to an exemplary embodiment of the present invention;

FIG. 4 is a view of a semiconductor package including the printed circuit board according to the exemplary embodiment shown in FIG. 3;

FIG. 5 is a flowchart illustrating a manufacturing method of the printed circuit board according to the exemplary embodiment of the present invention;

FIGS. 6A to 6E are views sequentially illustrating the manufacturing processes according to the manufacturing method of the printed circuit board according to the exemplary embodiment of the present invention; and FIGS. 7A and 7B are partially enlarged views of portion A of FIG. 6.

DESCRIPTION OF THE PREFERRED EMBODIMENTS

Terms and words used in the present specification and claims are not to be construed as a general or dictionary meaning, but are to be construed as meaning and concepts meeting the technical ideas of the present invention based on a principle that the inventors can appropriately define the concepts of terms in order to describe their own inventions in the best mode.

Throughout the present specification, unless explicitly described to the contrary, "comprising" any components will be understood to imply the inclusion of other elements rather than the exclusion of any other elements. A term "part," "module," "device," or the like, described in the specification means a unit of processing at least one function or operation and may be implemented by hardware or software or a combination of hardware and software.

Hereinafter, exemplary embodiments of the present invention will be described in detail with reference to the accompanying drawings.

FIG. 3 is a view showing a structure of a printed circuit board according to an exemplary embodiment of the present invention.

Referring to FIG. 3, the printed circuit board 320' according to the exemplary embodiment of the present invention is configured to include a base substrate 321, a cavity 321c, pads 322p and an electronic component 330. Here, the printed circuit board 320' including the electronic component 330 is substantially identical to a lower semiconductor package 320 of a semiconductor package to be described below.

The base substrate 321 includes a plurality of circuit patterns 322, 606 and 607. The base substrate 321 may have a single layer or multi layer structure. In the exemplary embodiment, the base substrate 321 of a multi layer structure will be described. Further, the circuit patterns 322, 606 and 607 are formed on at least one of the upper surface and the lower surface, or the inside of the base substrate 321. As shown in the drawing, in the base substrate 321 employed in the present invention, the circuit patterns 322, 606 and 607 are formed on all of the upper and lower surfaces and the inside of the base substrate 321.

The cavity 321c is formed above the base substrate 321. The cavity 321c serves to mount an electronic component 330 (e.g., a semiconductor chip) therein. Further, an alignment pattern 601 may be formed on the lower portion of the sidewall of the cavity 321c for forming the cavity (see FIG. 7A). The alignment pattern 601 is the remaining part of the protective layer 601 during the manufacturing process of the printed circuit board to be described below. The detailed description of which will be given below. The dimensions of the cavity 321c, that is, the width and depth are variable depending on the width and depth of an electronic component 330 mounted therein and on the manufacturing specifications of a semiconductor package to be described below.

The pads 322p are exposed through the substrate bottom surface of the cavity 321c and are embedded in the base substrate 321. The pads 322p exposed through the bottom surface of the substrate are the top surfaces of the respective circuit patterns 322. The upper surfaces of the pads 322p and the bottom surface of the cavity 321c are in the same plane. The detailed description of which will be given below.

The electronic component 330 is mounted in the cavity 321c and is electrically connected to the pads 322p. Here, the electronic component 330 includes external terminals and is mounted in a face-down position in which the external terminals face the pads 322p.

The printed circuit board according to the exemplary embodiment the present invention is preferably formed in the inside of the base substrate 321, and may further include vias 323, 604 and 605 electrically connecting the circuit patterns 322, 606 and 607 to each other and the pads 322p to the circuit patterns 322, 606 and 607.

Now, a manufacturing method of the printed circuit board according to the exemplary embodiment will be described.

For the sake of easy understating, FIG. 4 which illustrates a semiconductor package will be described after FIG. 5 and FIGS. 6A to 6E are described, which relate to a manufacturing method of the printed circuit board.

FIG. 5 is a flowchart illustrating a manufacturing method of the printed circuit board according to the exemplary embodiment, and FIGS. 6A to 6E are views sequentially illustrating the manufacturing processes of the manufacturing method of the printed circuit board according to the present invention.

Referring to FIG. 5 and FIGS. 6A to 6E, in a manufacturing method of a printed circuit board according to the present invention, firstly, a first protective layer 601 for protecting circuits is formed on a predetermined region of an upper surface of a base substrate 321 (S501, FIG. 6A). The base substrate 321 may have circuit patterns 322 formed on its upper and lower surfaces and its inside, and vias 323 connecting the upper and lower circuit patterns 322 formed therein.

The first protective layer 601 may be formed by removing the protective layer formed on both surfaces of a detach core used in the early process, leaving only a predetermined region for forming the cavity 321c to be described. Alternatively, the first protective layer 601 may be formed only on a predetermined region where the cavity 321c is to be formed, including the circuit patterns on the upper surface of the base substrate 321 and adjacent insulating portion. As the material for the protective layer, a single metal or an alloy may be used. In some cases, non-metal material may also be used.

After the first protective layer 601 is formed, insulating layers 602 and 603 are formed on the upper surface where the first protective layer 601 is formed and on the lower surface, respectively (S502, FIG. 6B). As the material for the insulating layers 602 and 603, synthetic resins (epoxy resins, polyester resins, urea resins, phenolic resins) may be used.

After the insulating layers 602 and 603 are formed, vias 604 and 605 are formed through the upper and lower insulators 602 and 603, and then circuits 606 and 607 are formed on the upper surface of the upper insulator 602 and on the lower surface of the lower insulator 603, respectively (S503, FIG. 6C). The vias 604 and 605 may be formed by forming holes in the upper and lower insulating layers 602 and 603 using a laser drill and then filling the holes with metal material (e.g., copper) by electrical plating. The circuits 606 and 607 formed on the upper and lower surfaces of the insulating layers 602 and 603 may be formed by performing photolithography using a mask.

After the circuits 606 and 607 are formed on the upper and lower surfaces of the insulators 602 and 603, second protective layers 608 and 609 for protecting circuits may be formed, at the gaps between the circuits 606 and 607, respectively (S504, FIG. 6D). As the material for the second protective layers 608 and 609, solder resist may be used. Again, photolithography using a mask may be used for forming the second protective layers 608 and 609.

After the second protective layers 608 and 609 are formed, a cavity 321c for mounting an electronic component 330 (shown in FIG. 3) is formed at a position in the upper insulating layer 602 where the first protective layer 601 has been formed (S505, FIG. 6E). Any one of wet etching and dry etching, preferably dry etching may be used for forming the cavity 321c.

In forming of the cavity 321c, the first protective layer 601 embedded in the upper insulating layer 602 is also removed, such that the top surfaces of the circuit patterns 322 exposed through the bottom of the cavity 321c are in the same plane with the bottom surface of the cavity 321c with no difference in level.

Since the plane of the circuits 322 exposed through the bottom of the cavity 321c where the electronic component 330 is mounted is flat with the plane of the bottom of the cavity 321c, an insulation distance may be formed high so that the electronic component 330 may be inserted into the cavity 321c. Accordingly, it is easy to obtain the depth of the cavity 321c with relatively wide ranges (e.g., 40 to 150 μm) in the upper insulating layer 602.

Further, in forming the cavity 321c, as shown in FIG. 7A, a part of the first protective layer 601 may remain at the lower portion of the sidewall of the cavity 321c. The remaining part of the first protective layer 601 may be used as an alignment mark to allow the electronic component 330 to be accurately mounted when the electronic component 330 is mounted in the cavity 321c in the process of manufacturing a semiconductor package. As appreciated, the first protective layer 601 may be completely removed when the cavity 321c is formed as shown in FIG. 7B.

Now, a description will be made referring back to FIG. 4.

FIG. 4 is a view of a semiconductor package including the printed circuit board according to the exemplary embodiment shown in FIG. 3.

Referring to FIG. 4, the semiconductor package including the printed circuit board according to the exemplary embodiment of the present invention has a PoP structure that an upper semiconductor package 310 is stacked on an lower semiconductor package 320.

The lower semiconductor package 320 includes a printed circuit board 320' having a cavity 321c of a predetermined size formed on a part of the upper surface, and an electronic component 330 mounted in the cavity 321c.

Further, the printed circuit board 320' is the one described above with reference to FIG. 3.

That is, the printed circuit board 320' includes the base substrate 321, the cavity 321c and the pads 322p.

The base substrate 321 includes a plurality of circuit patterns 322, 606 and 607. The base substrate 321 may have a single layer or multi layer structure. Further, the circuit patterns 322, 606 and 607 are formed on at least one of the upper surface and the lower surface, or the inside of the base substrate 321. As shown in the drawing, in the base substrate 321 employed in the present invention, the circuit patterns 322, 606 and 607 are formed on all of the upper and lower surfaces and the inside of the base substrate 321.

The cavity 321c is formed above the base substrate 321. The cavity 321c is formed to mount an electronic component 330 (e.g., a semiconductor chip) therein. Further, an alignment pattern 601 may be formed on the lower portion of the sidewall of the cavity 321c for forming the cavity. The alignment pattern 601 is the remaining part of the protective layer 601 during the manufacturing process of the printed circuit board. The dimensions of the cavity 321c, that is, the width and depth are variable depending on the width and depth of an electronic component 330 mounted therein and on the manufacturing specifications of a semiconductor package to be described below.

The pads 322p are exposed through the substrate bottom surface of the cavity 321c and embedded in the base substrate 321. The pads 322p exposed through the bottom surface of the substrate are the top surfaces of the respective circuit patterns 322. The upper surfaces of the pads 322p and the bottom surface of the cavity 321c are in the same plane.

The electronic component 330 is mounted in the cavity 321c and electrically connected to the pads 322p. Here, the electronic component 330 includes external terminals and is mounted in a face-down position in which the external terminals face the pads 322p.

The printed circuit board 320' according to the exemplary embodiment the present invention is preferably formed in the inside of the base substrate 321, and may further include vias 323, 604 and 605 electrically connecting the circuit patterns 322, 606 and 607 to each other and the pads 322p to the circuit patterns 322, 606 and 607.

As described above, according to the present invention, a cavity having a predetermined depth is formed in a base substrate of a printed circuit board so as to mount an electronic component therein, such that a gap between an upper semiconductor package and a lower semiconductor package may be obtained even if pitches between the balls are decreased for high density and high performance of the upper semiconductor package in the manufacturing of a semiconductor package having a PoP structure.

Further, since the plane of circuits exposed through the bottom surface of the cavity in which an electronic component is mounted is flat with the bottom surface of the cavity, an insulation distance may be formed high so that the electronic component may be inserted into the cavity. Accordingly, it is easy to obtain the depth of the cavity with relatively wide ranges in the upper insulating layer.

As stated above, according to the present invention, a cavity having a predetermined depth is formed in a base substrate of a printed circuit board so as to mount an electronic component therein, such that a gap between an upper semiconductor package and a lower semiconductor package may be obtained even if pitches between the balls are decreased for high density and high performance of the upper semiconductor package in the manufacturing of a semiconductor package having a PoP structure.

Although the exemplary embodiments of the present invention have been disclosed for illustrative purposes, the present invention is not limited thereto, but those skilled in the art will appreciate that various modifications, additions and substitutions are possible, without departing from the scope and spirit of the invention as disclosed in the accompanying claims. Therefore, the true scope of the present invention to be protected should be defined only by the appended claims and it is apparent to those skilled in the art that technical ideas equivalent thereto are within the scope of the present invention.

What is claimed:

1. A printed circuit board comprising:
   a first insulating layer forming one surface of a base substrate;
   an embedded circuit pattern embedded in the first insulating layer and exposed through the one surface of the base substrate;
   a second insulating layer comprising a circuit and laminated on the one surface of the base substrate and having a cavity formed therein, the second insulating layer being exposed through the cavity; and
   a metal layer disposed on the one surface of the base substrate and exposed through an inner wall of the cavity,
   wherein the metal layer is disposed on and abuts the surface of the base substrate, and the second insulating layer partially embeds the metal layer.

2. The printed circuit board as set forth in claim 1, wherein an upper surface of the embedded circuit pattern is disposed on the one surface of the base substrate.

3. The printed circuit board as set forth in claim 1, wherein the embedded circuit pattern comprises an embedded pad exposed through the cavity.

4. The printed circuit board as set forth in claim 1, further comprising a via formed in the second insulating layer and connected with the embedded circuit pattern.

5. The printed circuit pattern as set forth in claim 4, further comprising an exposed circuit pattern connected with the via and exposed to an outside on the second insulating layer.

6. The printed circuit board as set forth in claim 1, further comprising an electronic component installed in the cavity.

7. The printed circuit board as set forth in claim 1, wherein the embedded circuit pattern is disposed below the metal layer.

* * * * *